United States Patent [19]

Lien et al.

[11] Patent Number: 4,528,081
[45] Date of Patent: Jul. 9, 1985

[54] DUAL CURING SILICONE, METHOD OF PREPARING SAME AND DIELECTRIC SOFT-GEL COMPOSITIONS THEREOF

[75] Inventors: Qcheng S. Lien, South Windsor; Steven T. Nakos, East Hartford, both of Conn.

[73] Assignee: Loctite Corporation, Newington, Conn.

[21] Appl. No.: 538,624

[22] Filed: Oct. 3, 1983

[51] Int. Cl.$^3$ .............................................. C08F 2/46
[52] U.S. Cl. ............................... 204/159.13; 528/12; 528/34
[58] Field of Search ..................... 204/159.13; 528/34, 528/12

[56] References Cited

U.S. PATENT DOCUMENTS

| | | | |
|---|---|---|---|
| 3,417,161 | 12/1968 | Douds et al. | 260/825 |
| 3,782,940 | 1/1974 | Ohto et al. | 96/36 |
| 3,878,263 | 4/1975 | Martin | 260/405.5 |
| 3,933,712 | 1/1976 | Vanaglash, Jr. | 260/29.1 SB |
| 4,072,635 | 2/1978 | Jeram | 260/2.5 S |
| 4,087,585 | 5/1978 | Schulz | 428/429 |
| 4,201,808 | 5/1980 | Cully et al. | 428/40 |
| 4,271,425 | 6/1981 | Wong | 357/72 |
| 4,348,454 | 3/1981 | Eckberg | 428/334 |
| 4,374,967 | 2/1983 | Brown et al. | 528/15 |

FOREIGN PATENT DOCUMENTS 1323869  7/1973  United Kingdom .
2039287A 8/1980  United Kingdom .

OTHER PUBLICATIONS

D. Dickson, Jr., Proceedings Electric/Electronic Intel. Conf., 12, 92-95 (1975).

Primary Examiner—Melvyn I. Marquis
Attorney, Agent, or Firm—Walter J. Steinkraus; Eugene F. Miller

[57] ABSTRACT

Novel dual curing silicones are terminated with acrylic functional dialkoxy or diaryloxy silyl groups. They are prepared by condensation of a silanol terminated silicone with a silane represented by the formula

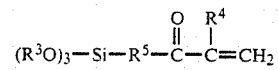

where $R^3$ is alkyl or aryl, $R^4$ is H or $C_{1-5}$ alkyl and $R^5$ is alkylene, the ratio of silane to silanol silicone being between about 2.1 and 6.1.

Compositions of the novel silicones with moisture cure catalysts, photoinitiators and optionally up to 70% trimethyl silyl terminated silicone oils, are both moisture and UV curable and produce soft gel or rubbery cured materials suitable for electronic potting applications.

11 Claims, No Drawings

DUAL CURING SILICONE, METHOD OF PREPARING SAME AND DIELECTRIC SOFT-GEL COMPOSITIONS THEREOF

BACKGROUND OF THE INVENTION

This invention relates to curable polyorganosiloxane (silicone) compositions particularly adapted for use in electronic potting applications.

Because of their excellent thermal stability, low temperature flexibility and high dielectric strength, silicones have been used for potting and encapsulating electrical devices such as integrated circuits. They are typically used as elastomeric or gel-like materials providing shock, vibrational and thermal stress protection on fragile electronic components. References relating generally to silicone gel encapsulants include U.S. Pat. Nos. 3,933,712; 4,072,635; 4,087,585; 4,271,425; 4,374,967; and D. Dickson, Jr., Proceedings Electric/Electronic Intel. Conf. 12, 92(1975). See also prior art description in U.S. Pat. No. 4,374,967. The present commercially available potting silicones include one component compositions such as U.S. Pat. No. 4,271,425 which are cured by moisture, requiring from several hours to days to complete the cure. Faster cures may be obtained from two component systems such as those in U.S. Pat. No. 4,087,585 if elevated temperatures are provided. The two-component systems which require a platinum catalyst, however, are inhibited by organotin compounds, sulfur, amines, urethanes and unsaturated hydrocarbon plasticizers on the substrate surfaces.

It is known that certain silicones containing methacrylate or acrylate functional groups may be cured by ultraviolet light. U.S. Pat. Nos. 4,201,808 and 4,348,454 and U.K. Patent Application No. GB 2039287A all describe UV curing compositions of silicones containing methacrylates or acrylates for paper release coatings. The compositions do not produce jelly-like or elastomeric materials.

Accordingly, it is desirable to have a UV curable silicone composition which will produce an elastomeric or soft gel consistency upon curing. Furthermore, it is desirable that the composition be capable of curing by another mechanism in areas which are not readily accessible by UV irradiation.

SUMMARY OF THE INVENTION

The present invention is a silicone composition having the desired characteristics set forth above. The composition cures to a soft gel or elastomeric consistency in a matter of seconds or minutes upon irradiation with UV light. Furthermore, the composition will moisture cure in shadow areas. The moisture cure capability, however, does not result in loss of the gel or elastomeric properties.

The compositions of the invention comprise a mixture, in parts by weight of:

(a) 30-100 parts of a reactive polyorganosiloxane terminated with acrylic functional dialkoxysilyl or diaryloxysilyl groups and containing 0.1-5 parts of a silicone moisture curing catalyst;

(b) 0-70 parts of a trimethylsilyl terminated silicone oil; and (c) an effective amount of a photosensitizer.

The novel reactive polyorganosiloxanes utilized in the inventive compositions and their method of preparation are also part of the present invention.

DETAILED DESCRIPTION OF THE INVENTION

The principal ingredient in the formulations of the invention are polyorganosiloxanes terminated with acrylic functional dialkoxysilyl or diaryloxysilyl groups. These silicones may be represented by formula (1):

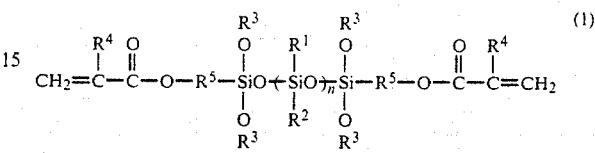

wherein $R^1$ and $R^2$ are organo groups including alkyls, such as methyl, ethyl etc., halo alkyls such as 3,3,3-trifluoropropyl, substituted or unsubstituted aryls such as benzyl or phenyl, and others such as vinyl, methacryloxypropyl, methoxy, mercaptopropyl, hydrogen or benzoin groups; $R^3$ is the same or different alkyl or aryl; $R^4$ is H or $C_{1-5}$ alkyl; $R^5$ is alkylene; and n is an integer greater than or equal to 80.

Preferably, $R^1$ and $R^2$ are alkyl groups, most preferably methyl. Phenyl groups are also suitable but high phenyl content silicones may excessively absorb UV irradiation, thereby reducing the cure through volume of the initial UV cure. If $R^1$ and $R^2$ include functional groups capable of crosslinking under the UV or moisture cure conditions, such as vinyl, methacryloxypropyl and methoxy, such groups should not be present in more than 2% by repeat unit.

For optimum moisture curing characteristics, $R^3$ will preferably be alkyls which have 3 or less carbon atoms. For optimum heat and hydrolytic stability of the $R^5$ linkage, $R^5$ is preferably between 3 and about 10 carbon atoms.

The number of repeat units in the silicone of formula (1) must be about 80 or more in order to obtain the desired gel or elastomeric properties in the cured materials. Although n does not have a theoretical limit, it will preferably not exceed 1500. More than 1500 repeat units gives a polymer which is difficult to process, apply and cure.

The moisture curing catalysts in the inventive formulation may be any methoxy silicone moisture cure catalyst which does not adversely affect the acrylic (e.g. initiating or inhibiting cure of the acrylic group). Preferred moisture catalysts are organotitanate catalysts such as tetraisopropylorthotitanate. The higher the amount of the organotitanate catalyst, the faster the curing speed. Consequently, the moisture cure speed may be tailored as desired. Typically the moisture cure catalyst will be present at a level of 0.1%-5% of the amount of reactive silicone of formula (1).

The silicone oils used in the formulations of the invention are trimethylsilyl terminated polydimethylsiloxanes having viscosity between about 100 and 5,000 cps. These oils are employed as plasticizers to control the texture and softness of the cured material and as diluents to adjust the final viscosity of the composition. For electronic potting compositions in which gel-like materials are desired, the plasticizing silicone oil should be present in the range of about 30-70% by weight of the composition. Lower amounts of silicon oil produce compositions which yield soft rubbery materials. Amounts of silicone oil in excess of about 70% produce materials which will flow even after curing.

The final ingredient of the inventive compositions is a photosensitizer. Photosensitizers which will initiate curing of the acrylic functionalities are well known in the art. They include benzoin and substituted benzoins, benzophenone, Michler's ketone, dialkoxybenzophenone, diethoxyacetophenone, etc. Any known photosensitizer can be used as well as mixtures thereof, without departing from the invention hereof. Further examples of such photosensitizers may be found in the aforementioned prior patents and in S. P. Pappas, "UV Curing: Science and Technology", Technology Marketing Corp. (1978). The amount of photosensitizer utilized in the inventive compositions will typically be in the range of 0.1%–5% of the composition. Depending on the characteristics of the particular photosensitizer, however, amounts outside of this range may be employed without departing from the invention hereof so long as they perform the function of rapidly and efficiently initiating polymerization of the acrylic groups.

The photosensitizer ingredient may also be polymer bound, e.g. as a portion of the $R^1$ or $R^2$ groups of the reactive silicone of formula (1). An example of polymer bound photoinitiators and techniques for producing same may be found in U.S. Pat. No. 4,271,425. Appropriate modifications of such techniques to produce polymer bound silicones having the dialkoxyacrylic-functional terminal groups are within the ordinary skill of persons in the silicone synthesis art.

The inventive compositions may also contain other additives so long as they do not interfere with the UV and moisture curing mechanisms. These include adhesion promoters such as 2,3-epoxypropyltrimethoxysilane, triallyl-S-triazine-2,4,6(1H,3H,5H)-trione and others known to those skilled in the art; fillers such as silica, microballoon glass, etc. Further examples of fillers usable to modify the texture of the inventive compositions may be found in U.S. Pat. No. 4,072,635 at Col. 4, line 40–Col. 5, line 7. If the application is for electronic devices, the additives should not include any ionic species.

In electronic applications, ion trapping compounds such as crown ethers and cryptates may be useful for reducing ionic conductivity. Examples are 18-crown-6, 12-crown-4 and 15-crown-5. See also U.S. Pat. No. 4,271,425 where the use of crown ethers in conventional RTV silicone encapsulants is described.

The reactive silicones of formula (1) are easily prepared from silanol terminated silicones of formula (2):

where $R^1$ and $R^2$ are defined as in formula (1). Silanol terminated dimethylsiloxanes of viscosity between about 500 cps and 50,000 cps will produce reactive silicones within the desired molecular weight range previously specified. For producing soft gel potting compounds silanol terminated dimethylsiloxanes of between about 600 cst and 20,000 cst are preferred, more preferably between 600 cst and 4000 cst.

Silanols of formula (2) are reacted with silane compositions of formula (3)

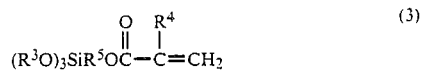

where $R^3$, $R^6$ and $R^5$ are also as defined as in formula (1) in the presence of a condensation catalyst such as an organotitanate to produce the reactive silicones of formula (1). Because of commercial availability and good reactivity of both the alkoxy and the acrylic groups, methacryloxytrimethoxysilane is the preferred compound of formula (3).

The mole ratio of silane to silanol terminated siloxane is between 2 and 6 (1–3 moles of trialkoxysilane per equivalent of silanol hydroxyl). Ratios of moles silane (3) to moles silanol (2) which are less than 2:1 produce gelled or taffy-like materials which cannot be usefully employed in the inventive compositions. As the molecular weights of the silanol increases, the minimum level of silane has been observed to increase slightly. Thus, a ratio of at least 2.2:1 is recommended when a 28,000 MW silanol terminated dimethylsiloxane is used, whereas a level of 2:1 is satisfactory for a 12,000 MW silanol terminated dimethylsiloxane.

The titanate catalyst is added in an amount of between 0.1 and 5% by weight. The preferred catalyst is tetraisopropanoltitanate. The catalyst and reactants are reacted between 10° C. and 200° C., preferably 60° C. to 120° C. A vacuum is applied during or after the reaction to remove substantially all of the theoretical amount of $R^3OH$ which is liberated from the reaction of the silanol groups of silicone (2) with silane (3).

The silicone oil and photoinitiator ingredients of the inventive compositions may be added to the composition before or after the reaction of silicone (2) and silane (3). After the reaction, the titanate catalyst level may be adjusted to alter the moisture cure characteristics of the composition.

The compositions of the invention will typically produce slightly softer materials if moisture cured compared to UV cured samples of the same compositions. The moisture cure is usually complete within 24–72 hours. After UV cure, or completion of moisture cure, the samples do not become noticeably harder on prolonged aging.

The actual physical characteristics of the cured products obtained from a given composition will depend on the molecular weight of the reactive silicone of formula (1) as well as on the method of cure employed and the amount of oil. In general, the higher the molecular weight of the reacted silicone the softer the cured product and the slower the cure. With silicones of formula (1) which have a molecular weight above about 35,000, the level of oil above which flowable cured products are produced may be somewhat less than 70%.

The following examples are illustrative of the invention.

EXAMPLE 1

In a round-bottomed flask 50.0 g of a hydroxyl terminated polydimethylsiloxane of 680 cst viscosity (0.3% hydroxyl by weight), 2.62 g methacryloxypropyltrimethoxysilane and 0.21 g tetraisopropylorthotitanate were reacted on a rotary evaporator and 10 mm Hg pressure and 80° C. for two hours. The viscosity of the mixture increased for the first hour and then decreased during the second hour. A full vacuum (approximately 0.5 mm Hg) was applied for an additional 4 hours at 80° C. The flask was removed from the evaporator and flushed with nitrogen. The reactive silicone product was a yellow liquid.

The product was then used to formulate mixtures with 100 cst or 1,000 cst trimethylsilyl terminated silicone oils. The mixtures ranged from 0-90% silicone oil. To each of these mixtures was added 2% by weight diethoxyacetophenone as photoinitiator. Samples of these compositions, about ¼" thick, were then cured by 1-2 minute exposure to UV irradiation of about 70,000 microwatts/cm² or by 24 hour moisture cure at ambient temperature and humidity. Above about 70% oil content, curing was very difficult and nonflowable products were not achieved by the moisture cure mechanism. Samples containing between 0 and 70% oil ranged, respectively, from a soft rubbery material (Shore A 10-15) to a very soft sticky gel (Shore A unmeasurable) which showed some tendency to creep but would not flow.

EXAMPLE 2

The synthetic procedure of Example 1 was repeated using 50.0 g of a 3500 cst hydroxyl terminated polydimethylsiloxane (28,000 MW), 1.05 g methacryloxypropyl trimethoxysilane and 0.2 og tetraisopropylorthotitanate. The product was a viscous liquid. A sample of the product was mixed with 2% diethoxyacetophenone and cured with UV irradiation of 70,000 microwatts/cm² to a stretchable soft rubber. Another sample of the same composition cured to a slightly softer rubber after 2½ days exposure to ambient temperature and humidity.

EXAMPLE 3

A methacryloxypropyldimethoxysilyl terminated dimethylsiloxane was prepared from 101.7 g of a 20,000 cst silanol terminated dimethylsiloxane, 2.6 g methacryloxypropyltrimethoxysilane and 0.3 g tetraisopropylorthotitanate in a manner similar to that of Examples 1 and 2 except that 100.9 g of a 100 cst trimethylsilyl terminated silicone oil was added to the mixture prior to heating. The resulting product had a viscosity of 21,200 cps.

3.05 g of the 21,200 cps product were then mixed with 0.6 g of the same 100 cst silicone oil and 0.07 g dimethoxyacetophenone. This composition, containing 58% oil, cured to a soft gel 1/16" deep upon exposure to UV of about 70,000 microwatts/cm² for 60 seconds.

193.8 g of the 21,200 cps product were mixed with 45 g of the 100 cst silicone oil and 5 g dimethoxyacetophenone. The mixture was cast into ⅛" thick open top molds and cured by UV light of the same intensity for six intervals of 20 seconds each, with a cooling period between each interval. The samples were then allowed to moisture cure overnight after which they were removed from the molds in 4"×4" square pieces, turned over, and the bottom surfaces subjected to three 20 second intervals of UV exposure to reduce tackiness. 4"×4" pieces were then subjected to electrical testing, the results of which are given in Table I below:

TABLE I

| Test Performed | Individual Values | Average Value |
|---|---|---|
| ASTM D-149, Dielectric Strength, volts/mil | 340 230 210 250 260 | 260 |
| ASTM D-256, Volume | 3.8 3.9 4.8 3.5 3.5 | 3.9 |
| Resistivity, 10¹⁴ ohm-cm | | |
| ASTM D-150, Dielectric Constant, 10² Hz | 2.87  4.28 | 3.58 |
| ASTM D-150, Dielectric Constant, 10⁵ Hz | 2.59  2.83 | 2.71 |
| ASTM D-150, Dissipation Factor, 10² Hz | 0.0018  0.0017 | 0.0018 |
| ASTM D-150, Dissipation Factor, 10⁵ Hz | 0.0012  0.0012 | 0.0012 |

We claim:

1. A composition capable of curing by both moisture cure and UV cure mechanisms, the composition comprising:
   (a) 30-100 parts by weight of a reactive polyorganosiloxane terminated with acrylic functional dialkoxy- or diaryloxy-silyl groups and containing about 0.1-5% of a silicone moisture curing catalyst;
   (b) 0-70 parts by weight of a trimethylsilyl terminated silicone oil; and
   (c) an effective amount of a photosensitizer, said photosensitizer present either as photosensitive groups bound to said reactive polyorganosiloxane or as a separate ingredient in admixture with components (a) and (b) above,
wherein the reactive polyorganosiloxane comprises the reaction product of a silanol terminated silicone represented by the formula:

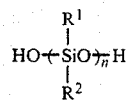

wherein $R^1$ and $R^2$ are organo groups, no more than 2% of which are crosslinkable under UV or moisture cure conditions, and n is an integer, said silanol having a viscosity of between about 600 and 20,000 cst, with an acrylic functional trialkoxy- or triaryloxysilane of the formula:

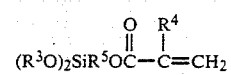

wherein $R^3$ are the same or different alkyl or aryl groups; $R^4$ is H or $C_{1-5}$ alkyl and $R^5$ is alkylene, in the presence of a condensation catalyst, the mole ratio of said silane to said silanol being between 2:1 and 6:1, and the reaction including removing substantially all of the theoretical amount of $R^3OH$ produced by the reaction.

2. A composition as in claim 1 wherein said photosensitizer is selected from substituted or unsubstituted benzoin, benzophenone, dialkoxybenzophenones, Michlers' ketone and diethoxyacetophenone.

3. A composition as in claim 1 containing a said trimethylsilyl terminated silicone oil, the silicone oil having a viscosity of between 100 and 5,000 cps.

4. A composition as in claim 1 having between 30 and 70% of said silicone oil.

5. A composition as in claim 1 wherein said moisture cure catalyst in an orthotitanate catalyst.

6. A composition as in claim 1 wherein said reactive polyorganosiloxane has a molecular weight of between about 12,000 and 50,000.

7. A composition as in claim 1 further comprising an adhesion promoter.

8. A composition as in claim 1 further comprising an ion trapping compound.

9. A composition as in claim 1 wherein said $R^1$ or $R^2$ organo groups on said silanol terminated silicone include photosensitizing groups, said groups comprising said photosensitizer ingredient c.

10. A composition as in claim 9 wherein said $R^1$ or $R^2$ photosensitizing groups comprise benzoin or benzoin ether groups.

11. A composition as in claim 1 wherein said silanol terminated silicone has a viscosity of between about 600 cst and 4000 cst.

* * * * *